United States Patent [19]

Braceras et al.

[11] Patent Number: 4,709,162
[45] Date of Patent: Nov. 24, 1987

[54] OFF-CHIP DRIVER CIRCUITS

[75] Inventors: George M. Braceras, South Burlington; Jeffrey H. Dreibelbis, Williston, both of Vt.

[73] Assignee: International Business Machines Corporation, Armonk, N.Y.

[21] Appl. No.: 908,849

[22] Filed: Sep. 18, 1986

[51] Int. Cl.$^4$ .................. H03K 19/003; H03K 19/094
[52] U.S. Cl. ...................................... 307/270; 307/475; 307/568
[58] Field of Search ..................... 307/200 B, 451, 475, 307/565, 568, 270

[56] References Cited

U.S. PATENT DOCUMENTS

| | | | |
|---|---|---|---|
| 3,631,528 | 12/1971 | Green | 307/251 |
| 4,064,405 | 12/1977 | Cricchi et al. | 307/205 |
| 4,345,172 | 8/1982 | Kobayashi et al. | 307/562 |
| 4,469,959 | 9/1984 | Luke et al. | 307/264 |
| 4,481,432 | 11/1984 | Davies, Jr. | 307/451 |
| 4,518,873 | 5/1985 | Suzuki et al. | 307/451 |
| 4,536,665 | 8/1985 | Dayton | 307/475 |

OTHER PUBLICATIONS

Furuyama, Tohru, et al, "An Experimental 4Mb CMOS DRAM", ISSCC Digest of Technical Papers, pp. 272–273, Feb. 1986.

*Primary Examiner*—John Zazworsky
*Attorney, Agent, or Firm*—Stephen J. Limanek

[57] ABSTRACT

An off-chip driver circuit is provided which includes a pull-up device disposed between an output terminal and a first voltage dropping diode which is connected to a first voltage supply source and a first voltage limiting circuit connected to the common point between the pull-up device and the voltage dropping diode. The off-chip driver circuit further includes an input inverter circuit having an output connected to the control element of the pull-up device. The inverter circuit has a P-channel field effect transistor and an N-channel field effect transistor serially connected with a second voltage dropping diode which is connected to the first voltage supply source and a second voltage limiting circuit connected to the common point between the second voltage dropping diode and the P-channel field effect transistor of the input inverter. First and second switches are also provided to short out the first and second voltage dropping diodes, respectively, when all circuits connected to the output terminal use a common voltage supply. A pull-down device serially connected to a pass device is provided between the output terminal and a point of reference potential. A buffer circuit having an output connected to the pull-down device is coupled to a second voltage supply source having a voltage significantly lower than the voltage of the first voltage supply source.

17 Claims, 1 Drawing Figure

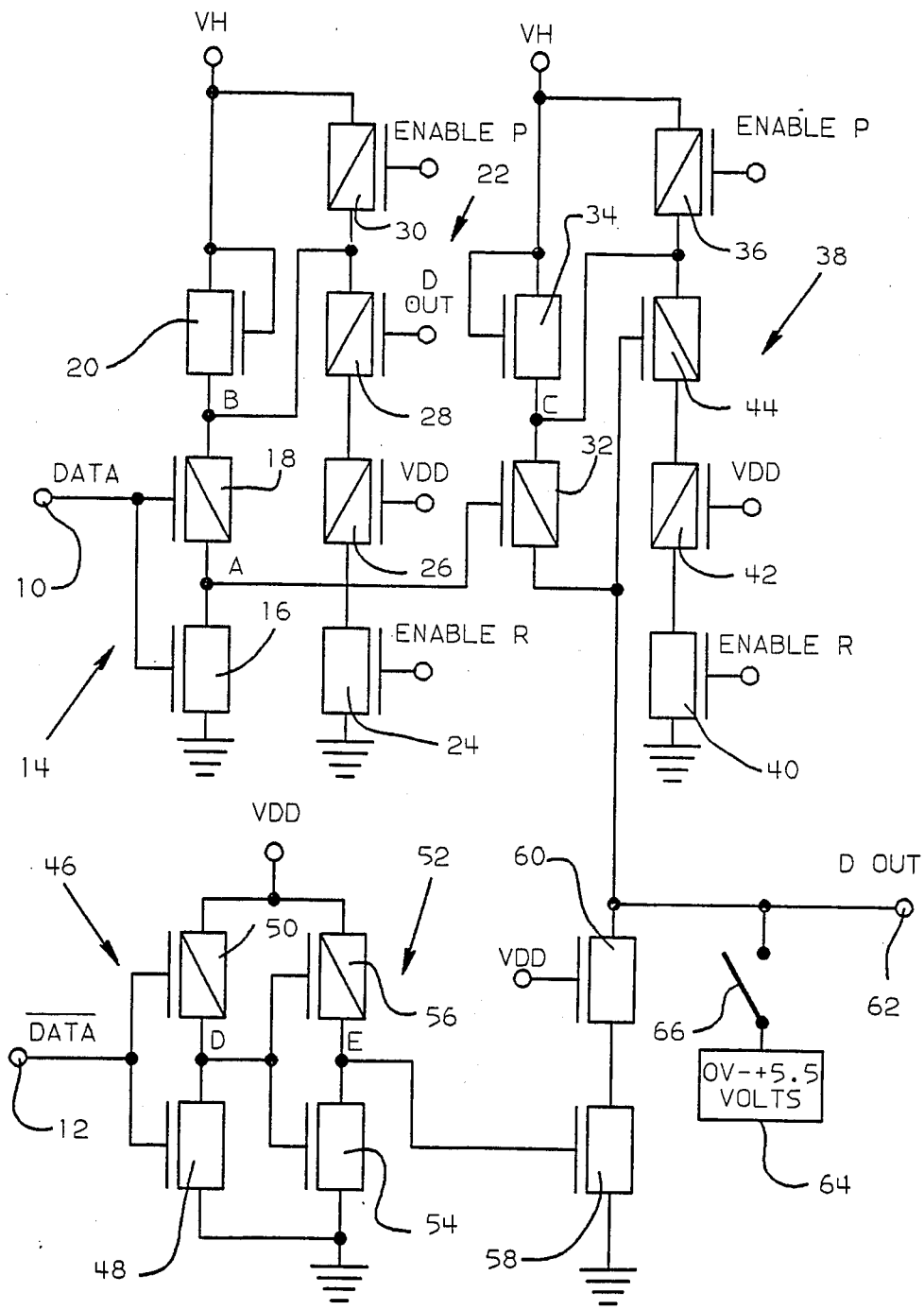

OFF-CHIP DRIVER CIRCUITS

DESCRIPTION

1. Technical Field

This invention relates to off-chip driver circuits and, more particularly, to an off-chip driver circuit which is part of a system wherein the input circuit to the off-chip driver circuit is designed in a lower supply voltage environment than is the circuit to which the output of the off-chip driver circuit is connected.

2. Background Art

Reduced scaling or shrinking of the geometries of devices used in integrated semiconductor circuit technology for forming denser circuits has required voltage supply sources to provide lower voltages than the heretofore generally accepted standard supply voltage of 5 volts, particularly in order to avoid a voltage breakdown in the insulation layers of the smaller devices. During the transition from 5 volt supplies to the lower voltage supplies of, say, 3.3 volts, a mix of circuits is being used wherein some of the circuits have been designed for use with standard 5 volt supplies while other circuits have been designed for use with the lower 3.3 volt supplies. In general, the geometries of memory circuits are reduced at a faster rate than are the geometries of logic circuits which are coupled to the memory circuits. In particular, complementary metal oxide semiconductor (CMOS) random access memories are currently being designed in 3.3 volt supply technology, whereas logic circuits, such as those of the transistor-transistor logic (TTL) type, which receive the output signals or data from the memories, are still being designed in a 5.0 volt supply technology. With these low voltage memory circuits feeding into the high voltage logic circuits through off-chip drivers, excessive voltage stress is encountered in the thin insulation or oxide layers of some of the devices in the off-chip drivers which form the interface between the memory and logic circuits, and, furthermore, undesirable current leakage paths are created therein.

In U.S. Pat. No. 4,536,665, filed by B. D. Dayton on Dec. 27, 1982, there is disclosed a circuit for converting emitter coupled logic (ECL) signals into transistor-transistor logic (TTL) signals.

U.S. Pat. No. 4,469,959, filed by K. Luke et al on Mar. 15, 1982, discloses a circuit for controlling the supply voltage to a complementary metal oxide semiconductor (CMOS) inverter circuit which uses first and second voltage sources wherein a voltage magnitude variation in the first supply source causes the second supply source to be connected to the inverter circuit.

U.S. Pat. No. 4,345,172, filed by S. Kobayashi et al on Nov. 13, 1979, discloses an output circuit which includes control means responsive to the output voltage.

U.S. Pat. No. 3,631,528, filed by R. S. Green on Aug. 14, 1970, discloses a low power complementary driver which includes means for turning an N-channel device off before a P-channel device is turned on and vice versa to reduce power consumption.

U.S. Pat. No. 4,518,873, filed by Y. Suzuki et al on Aug. 13, 1982, discloses a buffer circuit for driving a CMOS inverter with the use of delay circuits to prevent the flow of direct current.

U.S. Pat. No. 4,064,405, filed by J. R. Cricchi et al on Nov. 9, 1976, discloses a complementary MOS logic circuit having a plurality of power supplies and a diode connected to one of the power supply terminals.

DISCLOSURE OF THE INVENTION

It is an object of this invention to provide an improved off-chip driver circuit which interfaces between a first circuit with a given supply voltage and a second circuit with a supply voltage having a magnitude greater than that of the given supply voltage without producing a voltage stress on insulation or oxide layers in any of the devices of the off-chip driver and with minimum current leakage paths.

In accordance with the teachings of this invention, an off-chip driver circuit in which there are few, if any, reliability concerns, is provided which includes a pull-up device disposed between an output terminal and a first voltage dropping diode and a first voltage limiting circuit connected to the common point between the pull-up device and the voltage dropping diode. The off-chip driver circuit further includes an input inverter circuit having an output connected to the control element of the pull-up device. The inverter circuit has a P-channel field effect transistor and an N-channel field effect transistor serially connected with a second voltage dropping diode and a second voltage limiting circuit connected to the common point between the second voltage dropping diode and the P-channel field effect transistor of the input inverter. If desired, first and second switches may be provided to short out the first and second voltage dropping diodes, respectively, when all circuits connected to the output terminal use a common voltage supply. A pull-down device serially connected to a pass device is provided between the output terminal and a point of reference potential. The pull-down device is preferably an N-channel field effect transistor and the pull-up device is preferably a P-channel field effect transistor.

The foregoing and other objects, features and advantages of the invention will be apparent from the following more particular description of the preferred embodiments of the invention, as illustrated in the accompanying drawing.

BRIEF DESCRIPTION OF THE DRAWING

The FIGURE is a circuit diagram of a preferred embodiment of the present invention.

Best Mode for Carrying Out the Invention

Referring to the FIGURE of the drawing in more detail, there is shown a circuit diagram of a preferred embodiment of the off-chip driver circuit of the present invention. The circuit of the FIGURE is made in the CMOS technology with P-channel field effect transistors being indicated by a rectangle with a diagonal line formed therein and a gate electrode and with N-channel field effect transistors being indicated by a rectangle without a diagonal line and a gate electrode. The off-chip driver circuit of the present invention illustrated in the FIGURE includes first and second input terminals 10 and 12 for receiving complementary or differential signals DATA and $\overline{\text{DATA}}$, respectively, from any suitable signal source such as a sense amplifier of a CMOS memory system (not shown). The input terminal 10 is connected to the control gates of a first input inverter 14 having an N-channel field effect transistor 16 and a P-channel field effect transistor 18 with an output terminal or node A. An N-channel field effect transistor 20 connected as a voltage dropping diode is disposed between the input inverter 14 and a voltage power supply source VH having a voltage equal to a value preferably between 4.5 and 5.5 volts. The voltage drop across diode 20 is a threshold voltage equal to approximately one volt. The common point or node between the dropping diode 20 and the input inverter 14 is indicated as node B. A voltage limiting circuit 22 is connected between node B and a point of reference potential, such as ground. The voltage limiting circuit 22 is a series circuit including an N-channel transistor 24 having a voltage ENABLE R applied to the control gate thereof, P-channel transistor 26 having a voltage VDD applied to the control gate thereof and a P-channel transistor 28 having a voltage D OUT applied to the control gate thereof. A P-channel transistor 30 having a voltage ENABLE P applied to the control gate thereof is connected in parallel with the dropping diode 20.

The output A of the input inverter 14 is connected to the control gate of a P-channel transistor 32 which acts as a pull-up device. An N-channel transistor 34 connected in the form of a voltage dropping diode is connected between the pull-up device 32 and the power supply source VH. The common point or node between pull-up device 32 and the dropping diode 34 is indicated at C. A P-channel transistor 36 having an ENABLE P voltage applied to the control gate thereof is connected in parallel with the dropping diode 34. A second voltage limiting circuit 38 is connected between the node C and a point of reference potential. The voltage limiting circuit 38 includes serially arranged N-channel transistor 40 having an ENABLE R voltage applied to the control gate thereof, a P-channel transistor 42 having a voltage VDD applied to the control gate thereof and a P-channel transistor 44 having a voltage D OUT applied to the control gate thereof.

The complementary input terminal 12 which receives the signals $\overline{DATA}$ is connected to the input of a second input inverter 46 having an N-channel transistor 48 and a P-channel transistor 50 with the output node thereof being indicated by D. The second input inverter is connected between a power supply terminal VDD and a point of reference potential. Terminal VDD has a voltage less than VH, preferably less than two threshold voltages below the voltage at the supply source VH, e.g., 3.0–3.5 volts, and is generated on chip. The output or node D of the second input inverter 46 is connected to the input of a third inverter 52 having an N-channel transistor 54 and a P-channel transistor 56. The output terminal or node of the third inverter 52 is indicated by E. The output E is connected to the control gate of an N-channel transistor 58 acting as a pull-down device. An N-channel transistor 60, acting as a pass transistor, is connected between the output terminal D OUT 62 and the pull-down device 58. An external circuit or system, which may be a transistor-transistor logic (TTL) circuit, generally formed on a separate semiconductor chip having voltages which vary from 0 to +5.5 volts indicated at 64 is selectively connectable by any appropriate means to the output terminal 62 through switching means indicated at 66.

Each of the transistors in the off-chip driver circuit shown in the FIGURE are designed, along with transistors in circuits such as in the sense amplifier (not shown) connected to the input terminals 10 and 12, in a common semiconductor, e.g., silicon, substrate or chip, so as to operate at low voltages of, e.g., 3.3 volts. Thus, the dielectric or insulation layer interposed between the control gate and the channel region of the transistors, also known as the gate oxide, is made very thin in order to provide the transistors with acceptable threshold voltages. Having been designed to withstand 3.3 volt stresses, the gate oxide would breakdown if voltages of significantly greater magnitude were applied across the oxide.

Since in today's technologies, some circuits such as memory circuits, either dynamic or static, are preferably designed with 3.3 volt power supplies while other circuits such as logic circuits are preferably designed with 5.0 power supplies, yet these different circuits need to be interconnected, it has been found that some transistors at the interface between these different circuits have a reliability problem due to the overstressing of the gate oxide of the transistors of the lower supply voltage technology by the high voltage swings produced by voltages from the higher supply voltage technology on buses or terminals that are shared by the circuits of both technologies. Furthermore, it has been found that when circuits having different supply voltages are interconnected, some of the transistors of the circuits made in the lower supply voltage technology are undesireably turned on tending to discharge the voltage on the common bus.

The circuit of the present invention illustrated in the FIGURE eliminates or at least minimizes the hereinabove mentioned problems.

In the operation of off-chip driver circuit of the present invention, during standby the voltage on each of the input terminals 10 and 12 is at zero volts which provides a voltage of about 4.5 volts on the control gate of the pull-up transistor 32 due to the voltage drop through transistor 20 and a voltage of zero volts on the control gate of the pull-down transistor 58. During standby, the switch 66 may be closed and voltage swings from 0 to 5.5 volts may be applied to the output terminal 62. It can be seen that since the voltage on the control gate of the pull-up transistor 32 is at approximately 4.5 volts the stress on the gate oxide of the pull-up transistor 32 is minimal but transistor 32 may inadvertently turn on. However, with the inclusion of transistor 34 acting as a back-biased diode, a low impedance effect is not applied to system 64. With zero volts on the control gate of the pull-down transistor 58, a high voltage stress would be developed across its gate oxide except for the presence of the pass transistor 60. In order to prevent the voltage at node B, and thus node A, from increasing to the supply voltage VH, i.e., to rise as high as 5.5 volts, during a long standby due to subthreshold currents flowing through diode 20, the voltage limiting circuit 22 is designed to provide a leakage path when the voltage at node B rises to a threshold voltage above the voltage VDD with transistor 24 turned on by an ENABLE R voltage which may be derived from any suitable source, such as that disclosed in commonly assigned co-pending U.S. patent application having Ser. No. 908846 entitled, "Power Supply Adapter Systems," filed on even date by J. H. Dreibelbis et al. Likewise, in order to prevent the voltage at node C from rising over a threshold voltage above VDD, the voltage limiting circuit 38 is turned on to provide a leakage path between node C and ground. It can be seen that if the voltages at nodes B and C were permitted to rise to VH, the gate oxide of transistors 16, 18 and 32 would be overstressed. During the voltage limiting operation, the voltage ENABLE R is equal to VDD and voltage ENABLE P is equal to VH. The transistors 28 and 44 are gated by the output voltage D OUT on output terminal 62 to prevent a leakage path from output terminal 62 to ground whenever the output terminal 62 is pulled up to a high voltage VH during standby.

After standby, when complementary signals DATA and $\overline{\text{DATA}}$ are applied to the input terminals 10 and 12, the voltage swing at each of the input terminals 10 and 12 is from 0 to 3.3 volts and the output voltage at output terminal 62 swings between 0.6 and 2.4 volts for TTL technology. It should be noted that if the voltage dropping diodes 20 and 34 were not provided with the high supply voltage VH, excessive voltage stress would be created across the gate oxide of the transistors 16, 18 and 32. Furthermore, the transistors 20 and 34 are arranged as reverse bias diodes so as to prevent, in particular, current from passing through diode 34 when a high voltage is applied to the output terminal 62 from the high voltage system 64 during standby.

Although the voltage supply VH of 5 volts has been used to provide a desired drive to the output terminal 62, if preferred, the voltage supply VH may be provided with a lower voltage of, say, VDD, in which case the voltage dropping diodes 20 and 34 would not be required or desired. In this situation, the bypass transistors 30 and 36 are turned on by voltage ENABLE P to short circuit the diodes 20 and 34 and apply the voltage from the supply terminal VH directly to nodes B and C, and eliminating current flow or leakage through the voltage limiting circuits 22 and 38. The voltage ENABLE P may also be derived from the circuit such as an on-chip detector disclosed in the hereinabove referenced U.S. patent application. Furthermore, the voltage ENABLE P may be the same as or similar to the voltage ENABLE R.

The signals or voltages $\overline{\text{DATA}}$ on input terminal 12 are applied to the control gate of the pull-down transistor 58 through inverters 46 and 52 in a known manner.

It can be seen that the off-chip drive circuit of the present invention provides a high drive to the output terminal 62 without producing excessive stresses in gate oxides and with minimal or no direct current leakage paths.

While the invention has been particularly shown and described with reference to preferred embodiments thereof, it will be understood by those skilled in the art that various changes in form and details may be made therein without departing from the spirit and scope of the invention.

What is claimed is:

1. An off-chip driver circuit comprising
    a voltage supply source terminal having a given voltage applied thereto,
    an output terminal,
    a pull-up device disposed between said voltage supply source terminal and said output terminal,
    a voltage dropping diode disposed between said voltage supply source terminal and said pull-up device, and
    means for limiting the voltage at the common point between said voltage dropping diode and said pull-up device.

2. An off-chip driver circuit as set forth in claim 1 further including
    a data input terminal,
    an inverter having an input coupled to said input terminal and an output coupled to a control element of said pull-up device,
    a second voltage dropping diode disposed between said inverter and said voltage supply source terminal, and
    second means for limiting the voltage at the common point between said second voltage dropping diode and said inverter.

3. An off-chip driver circuit as set forth in claim 1 wherein said voltage limiting means includes a first field effect transistor having a control gate connected to said output terminal and a second field effect transistor having a control gate connected to a substantially fixed voltage having a magnitude less than that of said given voltage, said first and second transistors being serially arranged.

4. An off-chip driver circuit as set forth in claim 3 wherein said fixed voltage has a magnitude equal to substantially the magnitude of said given voltage minus two threshold voltage drops.

5. An off-chip driver circuit as set forth in claim 4 wherein said given voltage is equal to about +5 volts and said fixed voltage is equal to +3.3 volts.

6. An off-chip driver circuit as set forth in claim 2 wherein said second voltage limiting means includes a first field effect transistor having a control gate connected to said output terminal and a second field effect transistor having a control gate connected to a substantially fixed voltage having a magnitude less than that of said given voltage, said first and second transistors being serially arranged.

7. An off-chip driver circuit as set forth in claim 6 wherein said fixed voltage has a magnitude equal to substantially the magnitude of said given voltage less two threshold voltages.

8. An off-chip driver circuit as set forth in claim 7 wherein said given voltage has a magnitude of about +5 volts and said fixed voltage is equal to about +3.3 volts.

9. An off-chip driver circuit as set forth in claim 2 further including a pull-down device disposed between said output terminal and a point of fixed potential and a pass transistor disposed between said output terminal and said pull-down device.

10. An off-chip driver circuit as set forth in claim 9 further including
    a second data input terminal,
    a second voltage supply source terminal having a second voltage applied thereto having a magnitude less than that of said given voltage, and
    a buffer circuit coupled to said second voltage supply source terminal having an input connected to said second data input terminal and an output coupled to a control element of said pull-down device.

11. An off-chip driver circuit as set forth in claim 10 wherein said second voltage has a magnitude equal to substantially the magnitude of said given voltage less two threshold voltages.

12. An off-chip circuit as set forth in claim 11 wherein said given voltage has a magnitude of about +5 volts and said second voltage has a magnitude of about +3.3 volts.

13. An off-chip driver circuit as set forth in claim 10 wherein said buffer circuit includes first and second inverters with the output of said first inverter being connected to the input of said second inverter.

14. An off-chip driver circuit as set forth in claim 13 wherein each of said inverters is a complementary metal oxide semiconductor inverter, said pull-down device is an N-channel field effect transistor and said pull-up device is a P-channel field effect transistor.

15. An off-chip driver circuit comprising first voltage supply means for applying a voltage of a first magnitude, an output terminal, a pull-up device disposed between said voltage supply means and said output terminal, a diode disposed between said voltage supply means and said pull-up device, means for limiting the voltage at the common point between said diode and said pull-up device, a pull-down device disposed between said output terminal and a point of reference potential, a pass transistor disposed between said output terminal and said pull-down device, system means selectively connectable to said output terminal for applying voltages to said output terminal having magnitudes between zero volts and said first magnitude, second voltage supply means for supplying a voltage of a second magnitude less than that of said first magnitude, a buffer circuit coupled to said second voltage supply means, and means for supplying complementary data signals to a control element of said pull-up device and through said buffer circuit to a control element of said pull-down device.

16. An off-chip driver circuit as set forth in claim 15 wherein said first voltage supply means selectively supplies a voltage of said second magnitude and said system means selectively applies voltages to said output terminal having magnitudes between zero volts and said second magnitude and further including switching means for short circuiting said diode and inactivating said voltage limiting means when said first supply means supplied a voltage of said second magnitude and said system means applies voltages having magnitudes between zero volts and said second magnitude.

17. An off-chip driver circuit as set forth in claim 16 wherein said switching menas includes a P-channel field effect transistor connected in parallel with said diode and an N-channel field effect transistor disposed within said voltage limiting means.

* * * * *